United States Patent
Plymale, Sr. et al.

(10) Patent No.: US 6,747,585 B2
(45) Date of Patent: Jun. 8, 2004

(54) METHOD AND APPARATUS FOR INCREASING A DYNAMIC RANGE OF A DIGITAL TO ANALOG CONVERTER

(75) Inventors: Leroy Albert Plymale, Sr., North Richland Hills, TX (US); Curtis Layne Carley, Fort Worth, TX (US); Darrin Joseph Russell, Trophy Club, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/282,566

(22) Filed: Oct. 29, 2002

(65) Prior Publication Data

US 2004/0080441 A1 Apr. 29, 2004

(51) Int. Cl.$^7$ .................................................. H03M 1/66
(52) U.S. Cl. ........................ 341/144; 341/118; 341/120
(58) Field of Search ................................ 341/118, 120, 341/135, 144

(56) References Cited

U.S. PATENT DOCUMENTS

| | | | |
|---|---|---|---|
| 4,198,622 A | | 4/1980 | Connolly, Jr. et al. ............... 340/347 DA |
| 5,283,579 A | * | 2/1994 | Tasdighi et al. ............ 341/145 |
| 5,825,321 A | * | 10/1998 | Park ........................... 341/144 |
| 5,880,689 A | * | 3/1999 | Kushner ...................... 341/144 |
| 5,894,497 A | | 4/1999 | Overton ....................... 375/295 |
| 6,072,843 A | * | 6/2000 | Baker et al. ................. 375/340 |
| 6,097,324 A | | 8/2000 | Myer et al. .................. 341/118 |
| 6,154,160 A | * | 11/2000 | Meyer et al. ................ 341/139 |
| 6,198,419 B1 | | 3/2001 | Wen ............................ 341/145 |
| 6,204,782 B1 | | 3/2001 | Gonzalez et al. ............. 341/90 |
| 6,204,790 B1 | | 3/2001 | Jin et al. ..................... 341/145 |
| 6,507,304 B1 | * | 1/2003 | Lorenz ........................ 341/144 |

OTHER PUBLICATIONS

"14–Bit, 125 MSPS Dual TxDAC+ D/A Converter", Analog Devices, Inc. 2000, pp. 1–27.
Behzad Razavi, "Principles of Data Conversion System Design", Digital–to–Analog Converter Architectures Chapter 5, IEEE Circuits and Systems Society, Sponsor, The Institute of Electrical and Electronics Engineers, Inc. New York, pp. 84–95.

* cited by examiner

Primary Examiner—Michael Tokar
Assistant Examiner—Linh V Nguyen
(74) Attorney, Agent, or Firm—Posz & Bethards, PLC; Charles W. Bethards

(57) ABSTRACT

A digital to analog converter with increased dynamic range and improved linearity and method therefore includes an input (109) coupled to a digital word; a circuit, such as a typical digital to analog converter (103, 603), operable to convert the digital word to an analog signal (411, 611), such as an analog current (413, 613), that is proportional to the digital word in a discrete continuous fashion; and an output (106, 606) to couple the analog signal to a load (115), wherein the load is coupled to a bias voltage (407, 607) that increases the dynamic range or decrease the distortion of the analog signal.

22 Claims, 3 Drawing Sheets

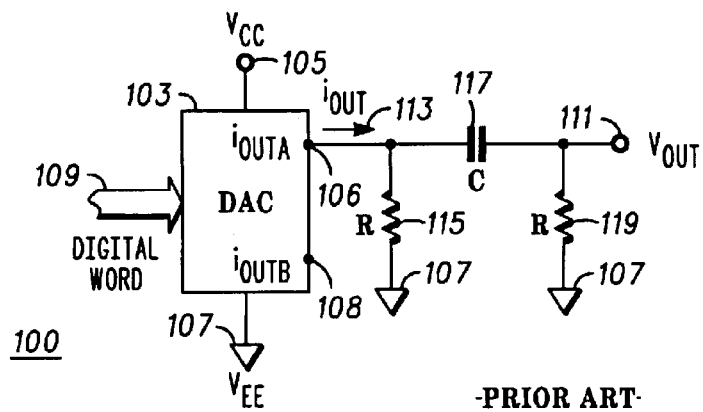
FIG. 1 -PRIOR ART-
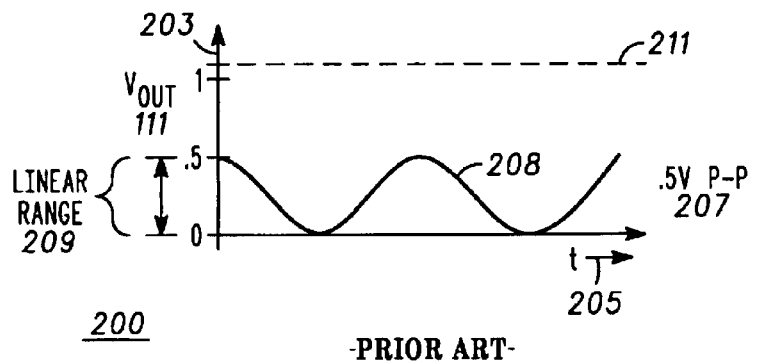
FIG. 2 -PRIOR ART-
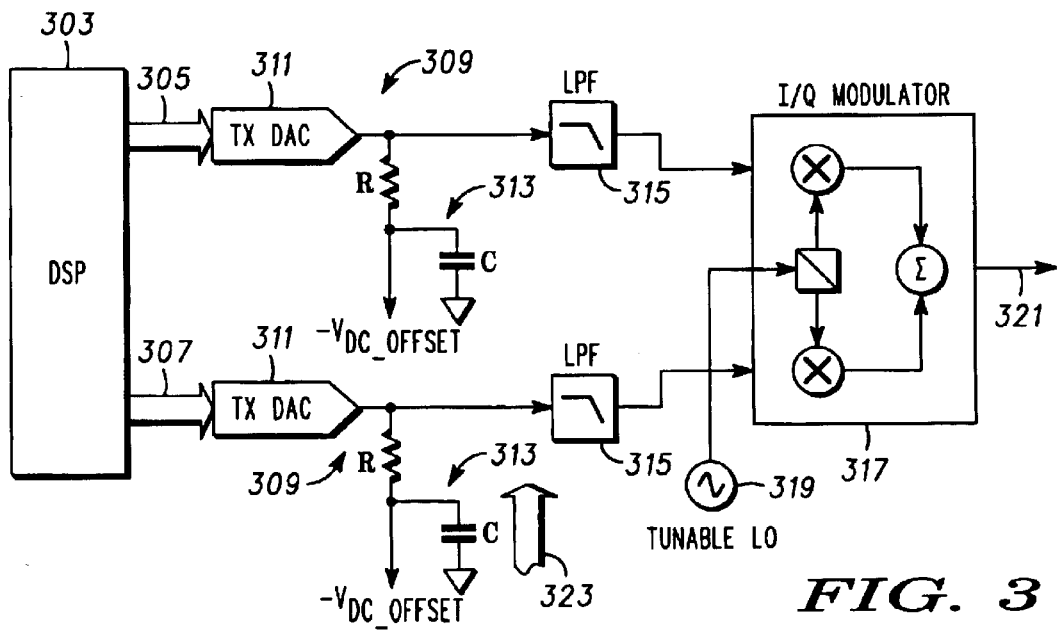
FIG. 3

US 6,747,585 B2

METHOD AND APPARATUS FOR INCREASING A DYNAMIC RANGE OF A DIGITAL TO ANALOG CONVERTER

FIELD OF THE INVENTION

This invention relates in general to communication systems and more specifically to methods and apparatus for increasing the dynamic range or linearity of digital to analog converters for use in such systems or others.

BACKGROUND OF THE INVENTION

Digital to Analog Converters (DACs) are known. Equally well known are the problems caused by the typical DAC in terms of limited dynamic range or limited linearity. These terms are somewhat synonymous in that linearity or the degree or extent of harmonic distortion or other forms of distortion is ordinarily specified at a certain output signal level or range. Alternatively the dynamic range may be specified in terms of the level that may be achieved with a distortion level not exceeding some amount. These specifications may depend on the voltage supply that is used for the DAC.

The literature is replete with sometime extraordinarily complex techniques for increasing the SFDR or spurious free dynamic range of DACs. For example U.S. Pat. No. 6,204,783 uses feedback while U.S. Pat. No. 6,097,324 uses clipping and feed forward techniques. U.S. Pat. Nos. 4,198, 622, 6,204,790, 6,198,419, and 5,894,497 all uses various forms of stacking DACs in attempts to improve linearity. One or two dB is considered a significant improvement in the field. Clearly a need exists for an elegant approach to improving range and linearity in a typical DAC.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages all, excepting prior art figures, in accordance with the present invention.

FIG. 1 depicts a prior art digital to analog converter circuit;

FIG. 2 illustrates a performance graph of the prior art digital to analog converter circuit of FIG. 1;

FIG. 3 depicts a block diagram of an IQ modulator portion of a transmitter suitable for utilizing a new digital to analog circuit;

DETAILED DESCRIPTION OF PREFERRED EMBODIMENTS

Figure 4:
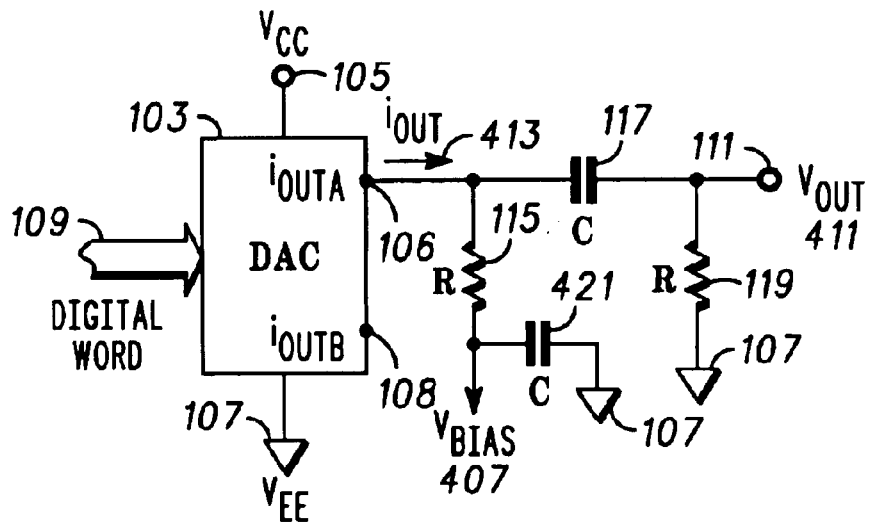
FIG. 4 illustrates a block diagram of a preferred embodiment of the new digital to analog circuit.

In overview, the present disclosure concerns methods of and circuits with increased dynamic range and improved linearity. Specifically a digital to analog converter circuit that will dramatically increase the dynamic range for a given degree of linearity is disclosed, discussed and described. This digital to analog converter having improved dynamic range and linearity while equally suitable for any application whether narrow or wideband, is particularly appropriate for applications that require a large percentage bandwidth, such as a CDMA signal with frequency components from a few hundred hertz to a few megahertz where the bandwidth limitations of a transformer or applications where cost and space condcerns related to a transformer may be an issue. It is also especially suited for applications where the incremental non-linearity associated with an additiional amplifier is a concern.

As further discussed below various inventive principles and combinations thereof are advantageously employed to extend the dynamic range or improve the linearity of a digital to analog converter, thus alleviating various problems associated with known converters, thereby advantageously facilitating lower parts count and superior performance converters, provided these principles or equivalents thereof are utilized.

The instant disclosure is provided to further explain in an enabling fashion the best modes of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It is further understood that the use of relational terms, if any, such as first and second, top and bottom, and the like are used solely to distinguish one from another entity or action without necessarily requiring or implying any actual such relationship or order between such entities or actions. Much of the inventive functionality and many of the inventive principles are best implemented using commercially available digital to analog converters together with the principles and concepts disclosed and described herein. It is expected that one of ordinary skill, notwithstanding some effort and some design choices motivated by, for example, available time, current technology, and economic considerations, when guided by the concepts and principles disclosed herein will be readily capable of selecting such a converter with minimal experimentation. Therefore, in the interest of brevity and minimization of any risk of obscuring the principles and concepts according to the present invention, further discussion of such converters, if any, will be limited to the essentials with respect to the principles and concepts used by the preferred embodiments.

Referring initially to FIG. 1, a prior art digital to analog converter circuit and its limitations and problems will be briefly discussed. FIG. 1 shows a digital to analog converter (DAC) 103 that is supplied or powered from a supply voltage Vcc 105 and referenced to a common potential $V_{EE}$ 107, such as a ground or 0 volt potential. The DAC is available in suitable forms from various manufacturers, including for example Analog Devices. An Analog Devices DAC that has been used is designated as AD9767. This is a high performance 14 bit, 125 Million sample per second, dual DAC device suitable for applications where an in phase (I) and quadrature (Q) signal needs to be converted from a digital to analog form. The DAC 103 includes differential output signals, namely $i_{OUTA}$ 106 and $i_{OUTB}$ 108 that may be used for driving a transformer or other circuit such as a conventional operational amplifier to convert the resultant differential signal to a single ended signal. Alternatively, one of the outputs, such as 106 may be used to directly generate a single sided output signal.

Basically the DAC 103 converts a digital word, such as a 14 bit digital word at input 109 to an analog signal, such as $V_{OUT}$ 111, with an amplitude or magnitude that is proportional to the magnitude of the digital word. Since the digital word only includes discrete values, the analog signal will appear as a discrete continuous signal. Subsequent filtering can be used to remove harmonics of the output signal where these harmonics are at multiples of the input sample rate. DACs, such as the AD9767 and AD9713 have outputs that are current sources that, respectively, source or sink an output current $i_{OUT}$ 113 and this output current when applied to a load, such as resistor 115 referenced to the potential 107, series capacitor 117, and resistor 119 referenced to the potential or ground 107, generates the output voltage 111.

The performance of the prior art DAC circuit of FIG. 1 is illustrated in FIG. 2 and will now be discussed and described. FIG. 2 depicts a graph 200 of output amplitude 203 as a function of time 205 for a sequence of digital words that correspond to a sine wave signal. The output signal $V_{OUT}$ 111 is shown as a 0.5V peak to peak 207 sine wave 208. Although the DAC is capable of generating currents at the output that would generate voltages of IV peak to peak, as indicated by the manufacturer, the best linearity for the DAC can be achieved by limiting the amplitude or magnitude of the output signal or sine wave 208 to the 0.5 volt peak to peak range and this is depicted as the linear range 209. The upper limit 211 for the voltage compliance range is shown as 1.25 volts.

If a larger output signal with good linearity is required, the practitioner has a problem. If a transformer is used, a larger amplitude signal with similar linearity is available however transformers have a finite percentage bandwidth and this will likely be a problem for signals such as code division base band signals where the signal includes frequency components ranging from a few hundred to a few mega hertz. If an amplifier is used in lieu of the transformer, additional distortion will be added to the output signal. If an additional amplifier is used to amplify the single sided output signal, as depicted, the amplifier will add additional distortion. Any of these approaches represent higher costs for additional components, additional failure opportunities, and additional physical space requirements for the components. Clearly a need exists for a better approach.

Referring to FIG. 3 a block diagram of an IQ modulator portion of a transmitter suitable for utilizing a new digital to analog circuit will be discussed and described. Depicted in FIG. 3 is a digital signal processor 303 that provides digital words corresponding to an I and a Q signal at inputs 305 and 307 of two inventive digital to analog converters 309. In one embodiment these words are supplied at 30.72 million words or 30.72 Mega samples per second for each of the I and Q channels or signals and the words correspond to an 8×over sampled wideband CDMA base band signal having a 3.84 Mcps (million chips per second) chip rate. The digital to analog converters 309 are comprised of known DACs 311 with a novel load and biasing arrangement 313 (further discussed below). The digital to analog converters 309 are each coupled to respective low pass filters 315 and from there to a known I/Q modulator 317 where the respective I and Q input signals are mixed with a signal provided by a local oscillator 319 to provide a radio frequency low level output signal 321. Often IQ modulators such as Gilbert cell modulators or mixers require closely controlled input levels for optimum performance. If the input level is too low the mixer noise will limit performance and if too high the mixer distortion will limit performance. Thus in systems where performance is at a premium, such as CDMA systems, especially wideband CDMA or 3G systems the IQ modulators must be carefully driven in order to optimize resultant performance. The arrow 323 represents the location in the block diagram where additional components such as amplifiers and the like would need to be added in order to increase the signal level to the IQ modulator without the new digital to analog converter herein disclosed.

Referring to FIG. 4 a block diagram of a preferred embodiment of the new digital to analog converter or circuit will be discussed and described. FIG. 4 shows a digital to analog converter with increased dynamic range or increased or improved linearity. As compared to the converter of FIG. 1 this digital to analog converter, for the same linearity or distortion or distortion ratio can provide nearly twice the output voltage range and thus has increased dynamic range. Alternatively, for the same output signal level this digital to analog converter has dramatically improved linearity or decreased distortion (approximately 12 dB improvement). The digital to analog converter includes an input 109 coupled to a digital word, such as for example a 14 bit digital word corresponding to an I or Q base band signal in a transmitter modulator for a CDMA system.

The digital to analog converter further includes a circuit operable to convert the digital word to an analog signal that is proportional to the digital word in a discrete continuous fashion. For example the circuit is, preferably, a DAC 103 such as discussed with reference to FIG. 1 widely available from manufacturers such as Analog Devices. The DAC is coupled to supply voltage 105 and a common potential 107, typically a ground potential or zero volt potential and operable to convert the digital word 109 to, and provide or couple at an output 106, an analog signal $V_{OUT}$ 411 or $i_{OUT}$ 413 to a load where the analog output signal is proportional to the digital word in a discrete continuous fashion as noted above. The load, resistor 115, or the combination of resistor 115, capacitor 117 and resistor 119 inter coupled as depicted is coupled to a bias voltage 407 that increases the dynamic range or improves the linearity of the analog signal over a predetermined range of the analog signal at the output or across or as applied to the load. Specifically resistor 115 is DC (direct current) coupled between the output 106 and a bias voltage $V_{BIAS}$ 407. Generally the capacitor 117 acts to AC couple the output to the load as well as DC decouple the same while the resistors 115 and 119 are selected to match the output to the load, such as the low pass filter in FIG. 3. The bias voltage will be different than the common potential for the circuit or DAC. Additionally a capacitor 421 is coupled between the bias voltage 407 and the common potential and used to provide an AC ground for AC output signals at output 106.

As noted the circuit or DAC is operable to convert or for converting the digital word to an analog current, for example $i_{OUT}$ 413 ($i_{OUT}$ 613 as in FIG. 6) that is proportional to the digital word in a discrete continuous fashion. The circuit or DAC 103 can operate as a current source as in FIG. 4 and thus supply the analog current to the load or as a current sink (as in FIG. 6) and operate to sink the current from the load. When the circuit or DAC is a current source type, the load or resistor 115 will be coupled to a bias voltage, $V_{BIAS}$ 407 that is lower or less than the common potential, for example negative 1.0 volts, for the circuit or DAC and this will increase the range of alternating current available and thus AC (alternating current) voltage swing available at the output of the circuit or DAC without increasing distortion generated by the circuit or DAC or alternatively allow the same range of current and corresponding voltage while decreasing the distortion generated by the circuit or DAC. When the circuit or DAC is operable to or operating to sink the analog current from the load or resistor 115, the load or resistor 115 will need to be coupled to a positive bias voltage or bias voltage that is greater than the common potential for the circuit or DAC in order to observe and enjoy the same benefits of increased output range or lower output distortion and thus improved or increased linearity.

Thus the digital to analog converter of FIG. 4 includes, in a preferred form, the circuit or DAC 103 that is operable to convert the digital word to an analog current 413 that is proportional to the digital word; and the output 106 couples the analog current to a load, resistor 115, that is coupled to a negative direct current (DC) voltage, $V_{BIAS}$ 407 relative to a common potential, $V_{EE}$ 107 for the circuit or DAC. With this arrangement an AC voltage at the output resulting from the analog current is centered about a DC potential that is closer to the common potential than it would otherwise be and a peak voltage level is further from the supply voltage 105 and thus further from a non-linearity or non-linearity causing potential or voltage for the circuit or DAC. In the case of the digital to analog converter of FIG. 6 where the circuit or DAC 603 has an output current sink or current sinking architecture, the output 608 couples the analog signal or analog current 613 to a load that is coupled to a $V_{BIAS}$ 607 that is a positive DC voltage relative to the common potential 107 for the circuit or DAC. Thus an AC voltage at the output resulting from the analog current is centered about a DC potential that is closer to the supply voltage 105 and further from a non-linearity or non-linearity causing potential or voltage of the circuit or DAC.

Figure 5:
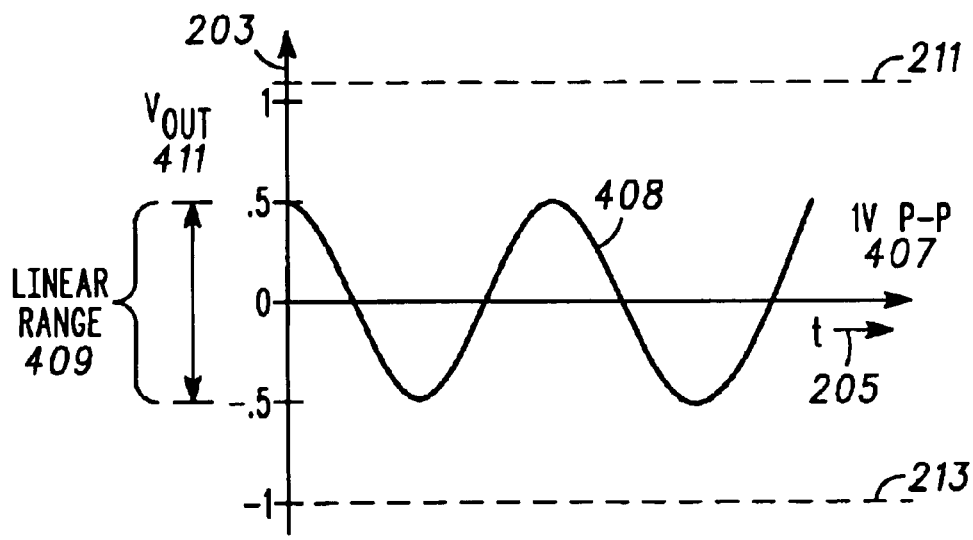
FIG. 5 illustrates the increased dynamic range of the new digital to analog converter.

Referring to FIG. 5 the dramatic and surprising increase in dynamic range of the new digital to analog converter is illustrated and will be discussed and described. FIG. 5 shows a graph with the same axis as FIG. 2, specifically amplitude 203 of $V_{OUT}$ 411 on the vertical and time 205 on the horizontal axis. A 1.0 Volt Peak to Peak 407 sine wave signal 408 corresponding to a converted sequence of digital words is depicted. The output signal $V_{OUT}$ 111 as shown is provided without increasing the distortion level experienced with the 0.5 Volt signal in FIG. 2. The linear range 409 of the new digital to analog converter is double the range of the prior art converter of FIG. 1. Again while the new DAC is capable of generating currents at the output that would generate voltages greater than 1V peak to peak the best linearity for the new DAC can be achieved by limiting the amplitude or magnitude of the output signal or sine wave 208 to the 1.0 volt peak to peak range or the linear range 409. The upper limit 211 for the voltage compliance range is shown as 1.25 volts and a lower limit 213 of negative 1.0 volt is also depicted.

The reason for this dramatic improvement can be appreciated from the following discussion. Generally commercial DACs such as the Analog Devices model discussed above have an output architecture that includes a current mirror arrangement for supplying current with the output current source being a device, such as an MOS or P-MOS device with a source terminal tied to a supply voltage that is a derivative of the supply voltage 105 for the DAC and with a drain terminal coupled for supplying the output current. As the voltage potential at the output increases the source to drain voltage decreases. As is known when the source to drain voltage decreases a sufficient amount or becomes small enough the output current or drain current becomes a function of that voltage thus producing a non-linear drain and thus output current from the DAC. By using the proper bias voltage 407 the available voltage range at the output can be increased before this non-linearity or voltage causing or resulting in a non-linear output or distortion is encountered. Essentially the mid point of the output signal is forced to be further from the non-linearity or voltage that results in non-linear operation of the output current mirror. The limit or one of the limiting factors in how much the bias voltage can be lowered is a breakdown voltage of some device within the circuit or DAC and this will be a function of the underlying process technology or architecture. Similar analysis or explanations can be applied to bipolar junction devices where typically a pnp device would be used as the output current mirror device where the collector is the output terminal for the DAC.

Figure 6:
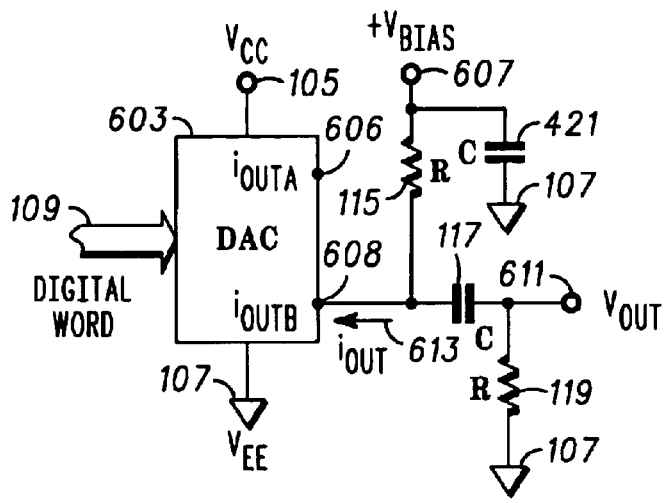
FIG. 6 depicts a block diagram of another preferred embodiment of the new digital to analog circuit.

Referring to FIG. 6 a block diagram of another preferred embodiment of the new digital to analog circuit will be briefly discussed and described as much of the operation has already been reviewed. The degree of improvement in dynamic range that may be expected from the FIG. 6 converter is similar to that portrayed in FIG. 5 or the degree of improved linearity is similar to that depicted in FIG. 7. FIG. 6 shows a circuit or DAC 603 supplied by the supply voltage 105 and referenced to the common potential 107 having output 606 and 608 that are differential outputs with an input 109 coupled to the digital word. The DAC operates to convert the digital word to an analog signal 611 or analog current 613 that corresponds to the digital word as above discussed. The output 608 is coupled to a load including resistor 115 that in this case is coupled to bias voltage 607 that is higher or larger than the common potential and will operate to pull the DC voltage at the output 608 higher or closer to the supply voltage and thus further from the common voltage. Capacitor 421 is coupled to the common potential and serves a similar purpose as the like capacitor in FIG. 4. Capacitor 117 couples the AC signals to the output 611 across resistor 119 or other equivalent load much as was done in FIG. 4. In this instance the output DAC architecture will be an npn bipolar transistor or n-MOS device again operating as a current sink. In this instance the bias voltage will keep the voltage across the device from becoming to low and that means keeping it sufficiently above the common potential in order to avoid the area of non-linear operation that results when the collector emitter voltage becomes too low or when the drain source voltage becomes too low.

Figure 7:
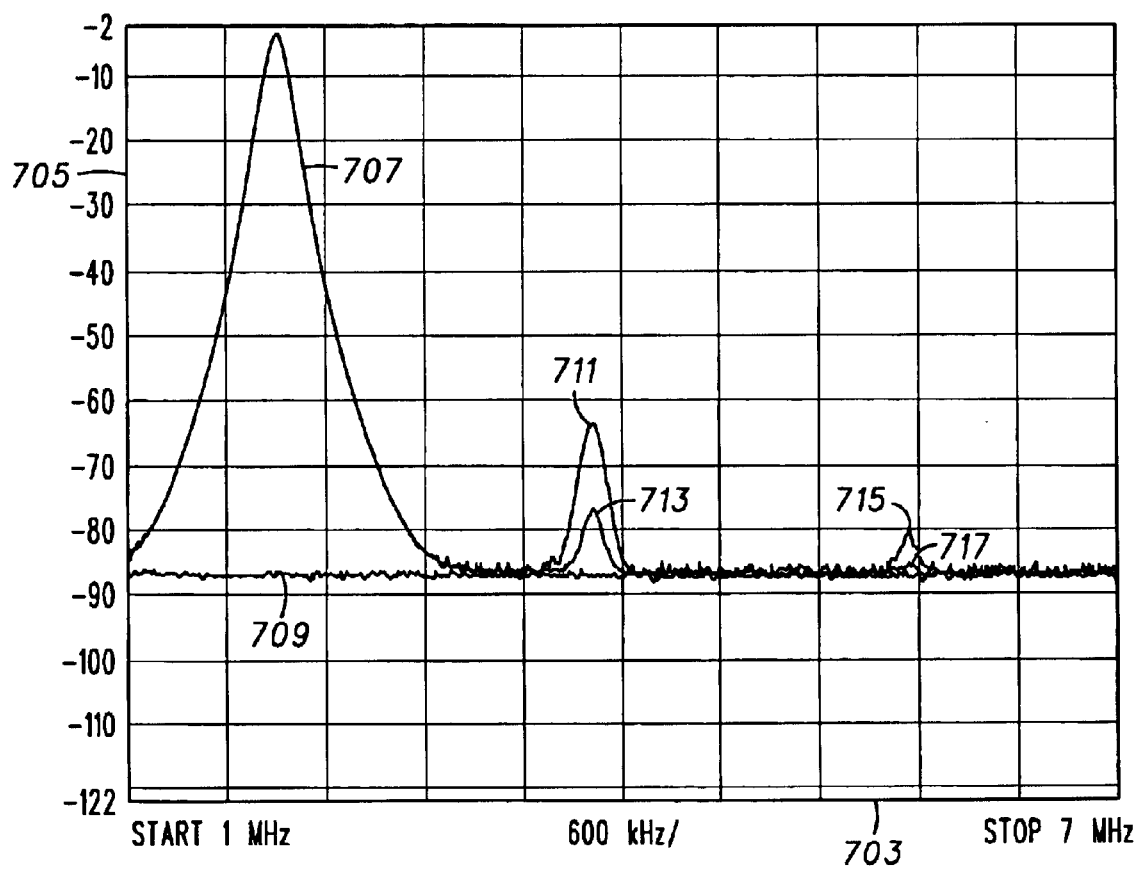
FIG. 7 illustrates a performance graph exemplifying the improved linearity of the new digital to analog circuit.

Referring to FIG. 7 a performance graph exemplifying the dramatic and surprising improved linearity of the new digital to analog circuit will be discussed and described. The FIG. 7 graph represents or shows experimental data where the prior art converter of FIG. 1 was compared to the new digital to analog converter of FIG. 4. FIG. 7 depicts output voltage amplitude in dB on the vertical axis 705 as a function of frequency on the horizontal axis 703. Basically there are three curves plotted with one being the noise floor 709 of the test equipment. The output signals from the prior art converter and the new digital to analog converter are the others. The test included applying digital words at the input of each converter that represent a 1.8 MHz sine wave and setting the gain of each to provide an equal magnitude or amplitude sine wave at the output. The fundamental component of each output signal is shown as 707 and they overlap. The second harmonic 711 from the prior art converter is approximately 12 dB larger than the second harmonic 713 from the new digital to analog converter. The third harmonic 715 from the known converter appears to be some 8 dB greater than this harmonic 717 from the new converter.

As a review the methodology used within the new digital to analog converter to obtain these dramatic improvements will be reviewed. We have discussed and described a method of increasing the dynamic range or improving the linearity of a digital to analog converter. The method includes providing a digital word; converting the digital word to an analog signal that is proportional to the digital word in a discrete continuous fashion using a circuit coupled between a supply voltage and a common potential; and coupling the analog signal to a load that is referenced to a bias voltage, that preferably, differs from the common potential, so as to improve the dynamic range of the analog signal. In one aspect the converting the digital word further includes converting the digital word to an analog current that is proportional to the digital word in a discrete continuous fashion.

Two techniques were discussed with one including converting the digital word to an analog current and supplying the analog current to the load, and the coupling the analog signal includes coupling the analog current to a load that is coupled to a bias voltage that is lower than the common potential, thereby increasing a voltage range available at the output without increasing distortion generated by the circuit. Another technique included converting the digital word to an analog current and sinking the analog current from the load and the coupling the analog signal included coupling the analog current to a load that is coupled to a bias voltage that is greater than the common potential, thereby increasing a voltage range available at the output without increasing distortion generated by the circuit.

Thus in one version the method includes converting the digital word to an analog signal or specifically converting the digital word to an analog current that is proportional to the digital word; and coupling the analog signal or analog current to a load that is coupled to a negative direct current (DC) voltage relative to the common potential for the circuit, wherein an alternating current voltage at the output resulting from the analog current is centered about a DC potential that is closer to the common potential and further from a non-linearity or non linearity causing potential of the circuit. In the other the method included converting the digital word to an analog signal, specifically converting the digital word to an analog current that is proportional to the digital word and then coupling the analog signal or the analog current to a load that is coupled to a positive direct current (DC) voltage relative to the common potential for the circuit, wherein an alternating current voltage at the output resulting from the analog current is centered about a DC potential that is closer to the supply voltage and further from a non-linearity or non-linearity causing potential of the circuit.

The apparatus, processes, and systems described and discussed above and the inventive principles thereof are intended to and will alleviate problems caused by prior art digital to analog conversion techniques. Using the above discussed principles and concepts of properly biasing a digital to analog converter will facilitate larger amplitude signal without increasing distortion or more linear (less distortion) signals of the same amplitude. The dramatic and surprising degree of improvement shown by experimental results is unprecedented in a field of art that is replete with very complex techniques that yield a fraction of the improvement shown by these elegant and inventive techniques. It is expected that one of ordinary skill given the above described principles, concepts and examples will be able to implement other alternative schemes such as varying the common potential and so on and that the claims below cover such other examples.

This disclosure is intended to explain how to fashion and use various embodiments in accordance with the invention rather than to limit the true, intended, and fair scope and spirit thereof The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A digital to analog converter with increased dynamic range, the digital to analog converter comprising:
    an input coupled to a digital word;
    a circuit having a non-linearity and operable to convert the digital word to an analog signal that is proportional to the digital word in a discrete continuous fashion; and
    an output to couple the analog signal to a load,
    wherein the load is coupled to a bias voltage, the bias voltage selected to force the analog signal away from the non-linearity and thereby increases the dynamic range of the analog signal.

2. The digital to analog converter of claim 1 wherein said circuit is further operable to convert the digital word to an analog current that is proportional to the digital word in a discrete continuous fashion.

3. The digital to analog converter of claim 2 wherein said circuit is further operable to supply the analog current to the load.

4. The digital to analog converter of claim 3 wherein said load is coupled to a bias voltage that is lower than a common potential for said circuit, thereby increasing the alternating current voltage range available at the output without increasing distortion generated by the circuit.

5. The digital to analog converter of claim 2 wherein said circuit is further operable to sink the analog current from the load.

6. The digital to analog converter of claim 5 wherein said load is coupled to a bias voltage that is greater than a common potential for said circuit, thereby increasing the alternating current voltage range available at the output without increasing distortion generated by the circuit.

7. The digital to analog converter of claim 1 wherein said load is coupled to a bias voltage that is a direct current bias voltage that differs from a common potential for said circuit.

8. The digital to analog converter of claim 1 wherein
    said circuit is operable to convert the digital word to an analog current that is proportional to the digital word; and
    said output couples the analog current to a load that is coupled to a negative direct current (DC) voltage relative to a common potential for the circuit,
    wherein an alternating current voltage at said output resulting from the analog current is centered about a DC potential that is closer to the common potential.

9. A digital to analog converter with increased linearity, the digital to analog converter comprising;
    an input coupled to a digital word;

a digital to analog converter (DAC) having a non-linearity, coupled to a supply voltage and a common potential, and operable to convert the digital word to an analog signal that is proportional to the digital word in a discrete continuous fashion; and an output to couple the analog signal to a load that is further coupled to a bias voltage, the bias voltage selected to force the analog signal away from the non-linearity and thereby improve the linearity of the analog signal over a predetermined range of the analog signal at the output.

10. The digital to analog converter of claim 9 wherein said DAC is further operable to convert the digital word to an analog current that is proportional to the digital word in a discrete continuous fashion.

11. The digital to analog converter of claim 10 wherein said DAC is further operable to supply the analog current to the load, and said load is coupled to a bias voltage that is lower than the common potential for said DAC, thereby decreasing distortion generated by said DAC for an alternating current voltage range at the output of said DAC.

12. The digital to analog converter of claim 10 wherein said DAC is further operable to sink the analog current from the load and said load is coupled to a bias voltage that is greater than the common potential for said DAC, thereby decreasing distortion generated by said DAC for an alternating current voltage range at the output of said DAC.

13. The digital to analog converter of claim 9 wherein said load is coupled to a bias voltage that is a direct current bias voltage that differs from a common potential for said DAC.

14. The digital to analog converter of claim 9 wherein said DAC is operable to convert the digital word to an analog current that is proportional to the digital word; and said output couples the analog current to a load that is coupled to a negative direct current (DC) voltage relative to the common potential for the circuit, wherein an alternating current voltage at said output resulting from the analog current is centered about a DC potential that is closer to the common potential and further from a non-linearity of the DAC.

15. The digital to analog converter of claim 9 wherein said DAC is operable to convert the digital word to an analog current that is proportional to the digital word; and said output couples the analog current to a load that is coupled to a positive direct current (DC) voltage relative to the common potential for the circuit, wherein an alternating current voltage at said output resulting from the analog current is centered about a DC potential that is closer to the supply voltage and further from a non-linearity of the DAC.

16. A method of increasing the dynamic range of a digital to analog converter, the method comprising:

providing a digital word;

converting the digital word to an analog signal that is proportional to the digital word in a discrete continuous fashion using a circuit having a non-linearity, the circuit coupled between a supply voltage and a common potential; and coupling the analog signal to a load that is referenced to a bias voltage selected to force the analog signal away from the non-linearity and thereby improve the dynamic range of the analog signal.

17. The method of claim 16 wherein said converting the digital word further includes converting the digital word to an analog current that is proportional to the digital word in a discrete continuous fashion.

18. The method of claim 17 wherein said converting the digital word to an analog current further includes supplying the analog current to the load, and said coupling the analog signal includes coupling the analog current to a load that is coupled to a bias voltage that is lower than the common potential, thereby increasing a voltage range available at the output without increasing distortion generated by the circuit.

19. The method of claim 17 wherein said converting the digital word to an analog current further includes sinking the analog current from the load and said coupling the analog signal includes coupling the analog current to a load that is coupled to a bias voltage that is greater than the common potential, thereby increasing a voltage range available at the output without increasing distortion generated by the circuit.

20. The method of claim 16 wherein said load is coupled to a bias voltage that is a direct current bias voltage that differs from a common potential for said circuit.

21. The method of claim 16 wherein said converting the digital word to an analog signal further includes converting the digital word to an analog current that is proportional to the digital word; and said coupling the analog signal includes coupling the analog current to a load that is coupled to a negative direct current (DC) voltage relative to the common potential for the circuit, wherein an alternating current voltage at said output resulting from the analog current is centered about a DC potential that is closer to the common potential and further from a non-linearity of the circuit.

22. The method of claim 16 wherein said converting the digital word to an analog signal further includes converting the digital word to an analog current that is proportional to the digital word; and said coupling the analog signal includes coupling the analog current to a load that is coupled to a positive direct current (DC) voltage relative to the common potential for the circuit, wherein an alternating current voltage at said output resulting from the analog current is centered about a DC potential that is closer to the supply voltage and further from a non-linearity of the circuit.

* * * * *